United States Patent [19]

Im

[11] Patent Number: 5,502,665

[45] Date of Patent: Mar. 26, 1996

[54] GALOIS FIELD MULTIPLIER

[75] Inventor: Jin Hyeock Im, Seoul, Rep. of Korea

[73] Assignee: Goldstar Co., Ltd., Seoul, Rep. of Korea

[21] Appl. No.: 341,183

[22] Filed: Nov. 18, 1994

[30] Foreign Application Priority Data

Nov. 20, 1993 [KR] Rep. of Korea .................. 24860/1993

[51] Int. Cl.$^6$ ..................................................... G06F 7/00
[52] U.S. Cl. ............................................................ 364/746.1
[58] Field of Search ................................. 364/746.1, 757

[56] References Cited

PUBLICATIONS

*IEEE Transactions on Computers*, vol. C–20, No. 12, pp. 1573–1575, Dec., 1971, New York.

*Primary Examiner*—Roy N. Envall, Jr.
*Assistant Examiner*—Chuong D. Ngo

[57] ABSTRACT

A Galois field multiplication method for a set of a finite number of elements which enables four arithmetical operations including an addition, a deduction, a multiplication and a division, and a multiplier utilizing the multiplication method are disclosed. The Galois field multiplication method easily realizes various Galois field multipliers by ANDing respective items of a multiplicand with a corresponding one of the items of a multiplier factor in a stepwise manner, rotating left values resulted from the AND operation at the previous step, exclusively ORing the respective values resulted from the rotation with the respective corresponding values resulted from the AND operation at the current step, and operating on the highest polynomial term generated at the previous step in accordance with a generated polynomial.

6 Claims, 5 Drawing Sheets

FIG. 1
PRIOR ART

| X | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | A | B | C | D | E | F |
| 2 | 0 | 2 | 4 | 6 | 8 | A | C | E | 3 | 1 | 7 | 5 | B | 9 | F | D |
| 3 | 0 | 3 | 6 | 5 | C | F | A | 9 | B | 8 | D | E | 7 | 4 | 1 | 2 |
| 4 | 0 | 4 | 8 | C | 3 | 7 | B | F | 6 | 2 | E | A | 5 | 1 | D | 9 |
| 5 | 0 | 5 | A | F | 7 | 2 | D | 8 | E | B | 4 | 1 | 9 | C | 3 | 6 |
| 6 | 0 | 6 | C | A | B | D | 7 | 1 | 5 | 3 | 9 | F | E | 8 | 2 | 4 |
| 7 | 0 | 7 | E | 9 | F | 8 | 1 | 6 | D | A | 3 | 4 | 2 | 5 | C | B |
| 8 | 0 | 8 | 3 | B | 6 | E | 5 | D | C | 4 | F | 7 | A | 2 | 9 | 1 |
| 9 | 0 | 9 | 1 | 8 | 2 | B | 3 | A | 4 | D | 5 | C | 6 | F | 7 | E |
| A | 0 | A | 7 | D | E | 4 | 9 | 3 | F | 5 | 8 | 2 | 1 | B | 6 | C |
| B | 0 | B | 5 | E | A | 1 | F | 4 | 7 | C | 2 | 9 | D | 6 | 8 | 3 |
| C | 0 | C | B | 7 | 5 | 9 | E | 2 | A | 6 | 1 | D | F | 3 | 4 | 8 |
| D | 0 | D | 9 | 4 | 1 | C | 8 | 5 | 2 | F | B | 6 | 3 | E | A | 7 |
| E | 0 | E | F | 1 | D | 3 | 2 | C | 9 | 7 | 6 | 8 | 4 | A | B | 5 |
| F | 0 | F | D | 2 | 9 | 6 | 4 | B | 1 | E | C | 3 | 8 | 7 | 5 | A |

GALOIS FIELD MULTIPLIER

BACKGROUND OF THE INVENTION

1. Field of the Invention

The present invention relates to a method of multiplying for a Galois field and a multiplier utilizing the Galois field multiplication method, and more particularly to a Galois field multiplication method and a multiplier utilizing the same, enabling an easy application to various cases by virtue of a generalization of algorithm and capable of minimizing the total number of gates used.

2. Description of the Prior Art

Error may be probably generated upon storing, transmitting and receiving digital signals. Such an error is difficult to be completely avoidable due to an effect caused by quantizing noise and the like basically present more or less in the nature. This means that to develop a device operable irrespective of the error is very prodigal. Consequently, a method has been generally used, in which an error estimated more or less is detected and corrected in accordance with a certain algorithm.

In such an error detecting and correcting method, error correction codes are used. Encoding and decoding of such error correction codes are realized on the basis of arithmetical theories relating to Galois field.

A set enabling an addition and a deduction, that is, closed for the addition and deduction operations is generally called an "Abelian group". A set enabling a multiplication in addition to the addition and deduction operations, that is, closed for the three operations including the multiplication operation is called a "ring". On the other hand, a set enabling the four arithmetical operations including a division in addition to the three operations, that is, closed for the four arithmetical operations is called a "field". Such a field may be a set of rational numbers and a set of real numbers.

Meanwhile, an error correction code is a set composed of a finite number of elements. Accordingly, such an error correction code requires a finite field which enables the four arithmetical operations and is closed for the four arithmetical operations. Such a finite field is generally called a "Galois field". In order to establish four arithmetical operations among finite elements of the Galois field and close the Galois field for the four arithmetical operations, the four arithmetical operations for the Galois field are defined differently from the general four arithmetical operations.

In re-defining the four arithmetical operations for the Galois field, multiplication is most important. For example, in a case of a most general Galois field which has $2^N$ elements (N=1, 2, 3, ... ), addition is easily calculated by exclusively ORing numbers of bits of individual elements. Deduction is calculated in the same manner as in the addition. On the other hand, division is calculated using an inversion table and the multiplication.

The Galois field which is a general 8-bit system has $2^8$ elements ($2^8$=256) and is denoted by GF(256). Characteristic of the Galois field is defined by a polynomial generating the Galois field. For example, GF(16) is expressed by a generated polynomial $G(X)$ ($G(X)=X^4+X+1$). FIG. 1 is a multiplication table for GF(16).

In the multiplication table, $X$, $X^2$ and $X^3$ are regarded as 2, 4 and 8, respectively ($X=2$, $X^2=4$, $X^3=8$). The multiplication table also uses the generated polynomial $G(X)$ ($G(X)=X^4+X+1$). In accordance with the Galois field theory, the following conditions are established:

$1+1=0$ $X+X=0$ $X^2+X^2=0$ $X^3+X^3=0$

When zero is substituted for the polynomial $G(X)$ ($G(X)=0$) in accordance with the operation theory, the following condition is established:

$X^4=X+1$

For example, a multiplication of 7 by 8 (7×8) is processed as follows:

$$
\begin{aligned}
7 \times 8 &= (4+2+1) \times 8 \\
&= (X^2+X+1) \times X^3 \\
&= X^5 + X^4 + X^3 \\
&= X^4(X+1) + X^3 \\
&= (X+1)(X+1) + X^3 \\
&= X^2 + X + X + 1 + X^3 \\
&= X^3 + X^2 + 1 \\
&= 8 + 4 + 1 \\
&= 13 \\
&= D_{16}
\end{aligned}
$$

Meanwhile, a general multiplication of $(A_3X^3+A_2X^2+A_1X+A_0) \times (B_3X^3+B_2X^2+B_1X+B_0)$ is processed as follows:

$$
\begin{array}{r}
\begin{array}{cccc} A_3 & A_2 & A_1 & A_0 \\ \times \quad B_3 & B_2 & B_1 & B_0 \end{array} \\ \hline
\begin{array}{cccc} A_3B_0 & A_2B_0 & A_1B_0 & A_0B_0 \end{array} \\
\begin{array}{cccc} A_3B_1 & A_2B_1 & A_1B_1 & A_0B_1 \end{array} \\
\begin{array}{cccc} A_3B_2 & A_2B_2 & A_1B_2 & A_0B_2 \end{array} \\
+\quad \begin{array}{cccc} A_3B_3 & A_2B_3 & A_1B_3 & A_0B_3 \end{array}
\end{array}
$$

$A_3B_3X^6 + (A_3B_2 + A_2B_3)X^5 + (A_3B_1 + A_2B_2 + A_1B_3)X^4 +$
$(A_3B_0 + A_2B_1 + A_1B_2 + A_0B_3)X^3 + (A_2B_0 + A_1B_1 + A_0B_2)X^2 +$
$(A_1B_0 + A_0B_1)X + A_0B_0 =$
$\{A_3B_3X^2 + (A_3B_2 + A_2B_3)X + (A_3B_1 + A_2B_2 + A_1B_3)\}X^4 +$
$(A_3B_0 + A_2B_1 + A_1B_2 + A_0B_3)X^3 + (A_2B_0 + A_1B_1 + A_0B_2)X^2 +$
$(A_1B_0 + A_0B_1)X + A_0B_0 =$
$\{A_3B_3X^2 + (A_3B_2 + A_2B_3)X + (A_3B_1 + A_2B_2 + A_1B_3)\}(X+1) +$
$(A_3B_0 + A_2B_1 + A_1B_2 + A_0B_3)X^3 + (A_2B_0 + A_1B_1 + A_0B_2)X^2 +$
$(A_1B_0 + A_0B_1)X + A_0B_0 =$
$(A_3B_3 + A_3B_0 + A_2B_1 + A_1B_2 + A_0B_3)X^3 +$
$(A_3B_2 + A_2B_3 + A_3B_3 + A_2B_0 + A_1B_1 + A_0B_2)X^2 +$
$(A_3B_1 + A_2B_2 + A_1B_3 + A_3B_2 + A_2B_3 + A_1B_0 + A_0B_1)X +$
$(A_3B_1 + A_2B_2 + A_1B_3 + A_0B_0)$

Assuming that the above multiplication is processed for a Galois field, the addition in each bracket pair in the final result of the multiplication means the exclusive OR operation. A multiplier capable of achieving such a multiplication may be embodied in various manners. For example, where a multiplier is to be made only for the final result using 2-input AND gates and 2-input exclusive OR gates, it requires 22 AND gates and 18 exclusive OR gates.

In such a multiplier, however, it is difficult to carry out a debug. Moreover, an increased number of elements of a Galois field and an increased number of degrees of a generated polynomial results in a difficulty to manually calculate the multiplication. Since there is no common factor in the result of the calculation, it is difficult to optimize the multiplier.

A general multiplier for a Galois field GF(16) is a circuit which uses two kinds of cells and realizes a calculation of $\gamma \times \beta + \theta$ for three elements $\gamma$, $\beta$ and $\theta$ of the Galois field, as shown in FIG. 2.

The elements $\gamma$, $\beta$ and $\theta$ can be expressed in the form of a polynomial as follows:

$$\gamma(X) = \gamma_3 X^3 + \gamma_2 X^2 + \gamma_1 X + \gamma_0$$

$$\beta(X) = \beta_3 X^3 + \beta_2 X^2 + \beta_1 X + \beta_0$$

$$\theta(X) = \theta_3 X^3 + \theta_2 X^2 + \theta_1 X + \theta_0$$

Also, a multiplication of $\gamma$ by $\beta$ can be expressed as follows:

$$\gamma \cdot \beta = \gamma(X) \cdot \beta(X) \ mod \ G(X)$$

Assuming that $\gamma \cdot \beta = K_3 X^3 + K_2 X^2 + K_1 X + K_0$, the following equation is established because mod $G(X)$ is identical to $G(X)$ of zero ($G(X)=0$):

$$\begin{aligned}\gamma \cdot \beta + \theta &= (K_3+\theta_3)X^3 + (K_2+\theta_2)X^2 + \\ &\quad (K_1+\theta_1)X + K_0 + \theta_0 \\ &= W_3 X_3 + W_2 X_2 + W_1 X_1 + W_0\end{aligned}$$

Cells in the first column of the multiplier shown in FIG. 2 execute the following operation:

$$\gamma^{(1)}(X) = \gamma(X)$$

$$\theta^{(1)}(X) = \theta(X) + \beta_0 \gamma(X)$$

Cells in the remaining i-th column of the multiplier execute the following operation:

$$\gamma^{(i+1)}(X) + X \gamma^{(i)}(X) \ mod \ G(X)$$

$$\theta^{(i+1)}(X) + \theta^{(i)}(X) + \beta_i \gamma^{(i+1)}(X)$$

Each cell executes two operations as follows:

$$\gamma_j^{(i+1)} = \gamma_{j-1}^i = \gamma_3^i \cdot P_j$$

$$\theta_j^{(i+1)} = \theta_{j-1}^{(i)} = \beta_i \cdot \gamma_j^{(i+1)}$$

where, "$A^{(i)}_j$" represents a cell positioned at the i-th column and the j-th row of a matrix of the multiplier.

In the first cell of the second column, for example, $\gamma_3 \beta_1$ are ANDed by an AND gate $AD_{2,1}$. The result of the AND operation and $\theta_0^{(1)}$ are exclusively ORed by an exclusive OR gate $XOR_{2,1}$. The result of the exclusive OR operation is outputted as $\theta_0(2)$. In the second cell, $\gamma_3^{(0)}$ and $\gamma_0$ are exclusively ORed by an exclusive OR gate $XOR_{2,2}$. The result of the operation by the exclusive OR gate $XOR_{2,2}$ is sent to an AND gate $AD_{2,3}$.

The output from the exclusive OR gate $XOR_{2,2}$ is then ANDed with another input $\beta_1$ in the AND gate $AD_{2,3}$. An output from the AND gate $AD_{2,3}$ is exclusively ORed with $\theta_1^{(1)}$ by an exclusive OR gate $XOR_{2,3}$ which, in turn, outputs $\theta_1^{(1)}$. In such a manner, all columns execute the calculation. Outputs at cells of the final column after completing the calculation are as follows:

$$\theta_0^{(4)} = W_0$$

$$\theta_1^{(4)} = W_1$$

$$\theta_2^{(4)} = W_2$$

$$\theta_3^{(4)} = W_3$$

In such a conventional Galois field multiplier, however, flows of signals are obscure. Furthermore, the multiplier is difficult to extend to other Galois field such as GF(256). The multiplier has a disadvantage in that it is difficult to be applied for encoding and decoding of error correction code.

SUMMARY OF THE INVENTION

Therefore, an object of the invention is to provide a Galois field multiplication method capable of easily realizing various Galois field multipliers by ANDing respective items of a multiplicand and respective corresponding one of items of a multiply factor in a stepwise manner, rotating left values resulted from the AND operation at a previous step, exclusively ORing respective values resulted from the rotation and respective corresponding values resulted from the And operation at a current step, and operating the highest item generated at the previous step in accordance with a generated polynomial, and to provide a multiplier utilizing the Galois field multiplication method capable of achieving an obviousness in flow of signals.

In accordance with one aspect, the present invention provides a Galois field multiplier for operating a multiplicand and a multiplier of a Galois field, comprising: a first operating unit including first AND gates each for ANDing a value of each corresponding bit of the multiplicand by a value of the most significant bit of the multiplier; a second operating unit including second AND gates each for multiplying a value of each corresponding bit of the multiplicand by a value of the second most significant bit of the multiplicand, first exclusive OR gates each for operating each output value of the second AND gates and each corresponding one of values respectively obtained by rotating left output values of the first AND gates, and second exclusive OR gates each for operating an output value of each of ones of the first exclusive OR gates respectively corresponding to items of a generated polynomial of the Galois field exclusive of the highest item and the lowest item and an output value of the most significant one of the first AND gates; and a plurality of additional operating units respectively connected to output stages of the second operating unit and corresponding to the remaining bits of the multiplier factor from the third most significant bit to the least significant bit, each of the additional operating units having the same construction as the second operating unit.

In accordance with another aspect, the present invention provides a Galois field multiplication method comprising the steps of: (A) ANDing each bit of a multiplicand of a Galois field and the most significant bit of a multiplier factor of the Galois field; (B) (b-1) ANDing each bit of the multiplicand and the second most significant bit of a multiplier factor, (b-2) rotating left each of bits obtained at the step (A), (b-3) exclusively ORing each of bits obtained at the step (b-1) and each corresponding one of bits obtained at the step (b-2), and (b-4) exclusively ORing each of values respectively obtained at the step (b-3) and corresponding to items of a generated polynomial of the Galois field exclusive of the highest item and the lowest item and the most significant one of the bits obtained at the step (A); and (C) sequentially processing a result obtained at the step (B) in the same manner as at the step (B), the step (C) including a plurality of processing steps respectively corresponding to the remaining bits of the multiplier factor from the third most significant bit to the least significant bit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other objects and aspects of the invention will become apparent from the following description of embodiments with reference to the accompanying drawings which are given by way of illustration only, and thus are not limitative of the present invention, and in which:

FIG. 1 is a table for a multiplication of GF(16) defined by a generated polynomial G(X) (G(X)=$X^4$+X+1);

DETAILED DESCRIPTION OF THE PREFERRED EMBODIMENTS

Figure 2:
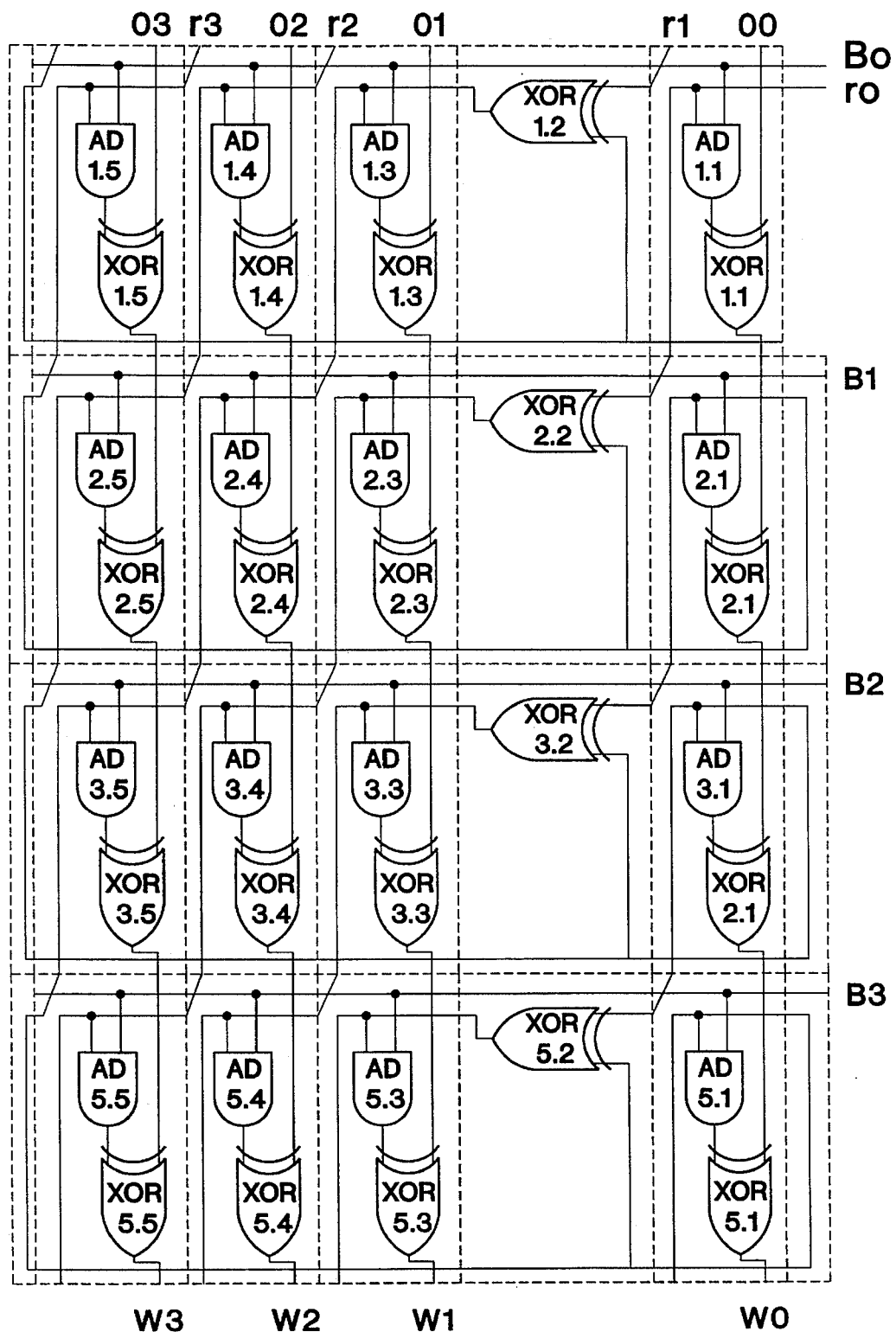
FIG. 2 is a circuit diagram illustrating a conventional Galois field multiplier for the Galois field shown in FIG. 1.
Figure 3:
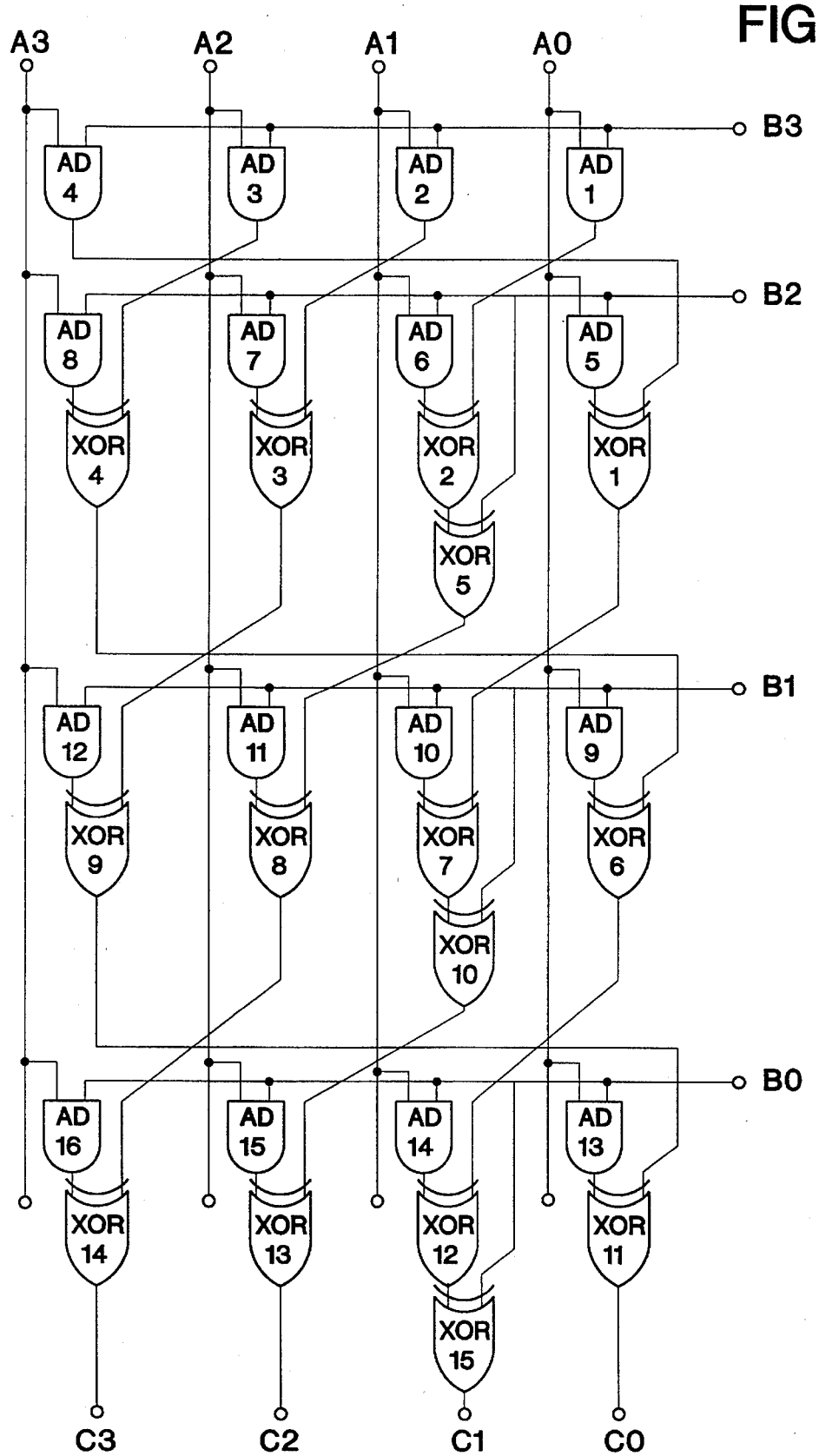
FIG. 3 is a circuit diagram of a multiplier to which a multiplication method of the present invention is applied in accordance with a first embodiment of the present invention in order to realize a multiplication for the Galois field of FIG. 1.

FIG. 3 is a circuit diagram of a multiplier to which a multiplication method of the present invention is applied in accordance with a first embodiment of the present invention. In accordance with the embodiment of the present invention, the multiplier of FIG. 3 is adapted for GF(16). The multiplier for GF(16) receives, as its inputs, a multiplicand and a multiplier factor which are two elements of GF(16), respectively. The multiplicand is expressed by four bits A3, A2, A1 and A0 whereas the multiplier factor is expressed by four bits B3, B2, B1 and B0. As shown in FIG. 3, the multiplier includes AND gates AD1 to AD4 each for multiplying each corresponding bit of the multiplicand by the most significant bit B3 of the multiplier factor. The multiplier also includes AND gates AD5 to AD8 each for multiplying each corresponding bit of the multiplicand by the second most significant bit B2 of the multiplier factor, exclusive OR gates XOR1 to XOR4 each for rotating left an output of each corresponding one of the AND gates AD1 to AD4 and adding a value resulted from the left rotation to an output of each corresponding one of the AND gates AD5 to AD8, and an exclusive OR gate XOR5 for adding an output of the exclusive OR gate XOR2 arranged in one of items remaining after the highest item and the lowest item are omitted from a generated polynomial of GF(16) to an output of the AND gate AD4. The multiplier further includes AND gates AD9 to AD12 each for multiplying each corresponding bit of the multiplicand by the third most significant bit B1 of the multiplier factor, exclusive OR gates XOR6 to XOR9 each for rotating left an output of each corresponding one of the exclusive OR gates XOR1, XOR5, XOR3 and XOR4 and adding a value resulted from the left rotation to an output of each corresponding one of the AND gates AD9 to AD12, and an exclusive OR gate XOR10 for adding an output of the exclusive OR gate XOR7 arranged in one of the remaining items to an output of the exclusive OR gate XOR4. The multiplier further includes AND gates AD13 to AD16 each for multiplying each corresponding bit of the multiplicand by the least significant bit B0 of the multiplier factor, exclusive OR gates XOR11 to XOR14 each for rotating left an output of each corresponding one of the exclusive OR gates XOR6, XOR10, XOR8 and XOR9 and adding a value resulted from the left rotation to an output of each corresponding one of the AND gates AD13 to AD16, and an exclusive OR gate XOR15 for adding an output of the exclusive OR gate XOR9 arranged in one of the remaining items to an output of the exclusive OR gate XOR12.

Now, the Galois field multiplication method of the present invention and the multiplier embodied in accordance with the method will be described in detail.

A general multiplication is operated as follows:

Example 1)

$$\begin{array}{rcccc}
 & a_3 & a_2 & a_1 & a_0 \\
\times & b_3 & b_2 & b_1 & b_0 \\
\hline
 & a_3b_0 & a_2b_0 & a_1b_0 & a_0b_0 \\
 & a_3b_1 & a_2b_1 & a_1b_1 & a_0b_1 \\
 & a_3b_2 & a_2b_2 & a_1b_2 & a_0b_2 \\
+\ a_3b_3 & a_2b_3 & a_1b_3 & a_0b_3 \\
\hline
 & a_3b_2 & & a_1b_0 & a_0b_0 \\
a_3b_3\ + & a_2b_3 & \ldots & + & a_0b_1 \\
\end{array}$$

Otherwise, the following multiplication is also established:

Example 2)

$$\begin{array}{rcccc}
 & a_3 & a_2 & a_1 & a_0 \\
\times & b_3 & b_2 & b_1 & b_0 \\
\hline
 & a_3b_3 & a_2b_3 & a_1b_3 & a_0b_3 \\
 & a_3b_2 & a_2b_2 & a_1b_2 & a_0b_2 \\
 & a_3b_1 & a_2b_1 & a_1b_1 & a_0b_1 \\
+ & & a_3b_0 & a_2b_0 & a_1b_0 & a_0b_0 \\
\hline
 & a_2b_3 & & a_1b_0 & a_0b_0 \\
a_3b_3\ + & a_3b_2 & \ldots & + & a_1b_0 \\
\end{array}$$

Although the above two operation methods (Examples 1 and 2) are basically identical to each other, only the former method of Example 1 is used in the general four arithmetical operations because the addition of the general four arithmetical operations involves a carry.

In an addition for Galois field, however, a phenomenon where the degree of the highest item of a generated polynomial G(X) is decreased occurs because the addition involves no carry, thereby establishing a condition of G(X)= 0. For example, in a case of G(X)=$X^4$+X+1, "$X^4$" is equal to "X+1" ($X^4$=X+1). In other words, "$X^4$" is substituted by "X+1".

Therefore, for the multiplication for Galois field, it can be found that the latter method of Example 2 is rather appropriate.

The Galois field multiplication method of the present invention will now be described in a stepwise manner.

First, a multiplication operation is executed using the above-mentioned latter operation method of Example 2. For a Galois field consisting of $2^N$ elements (N=1, 2, 3, ... ), the multiplication operation is identical to an AND operation. By the multiplication operation, $2^N \times 2^N$ items (16 items in the case of Example 2) are generated. In order to execute an addition operation, the generated items are arranged in a manner as in Example 2.

Second, as in the following Example 3, operated values in the first column $C_1$ are added to operated values in the second column $C_2$. If the addition of Example 3 is the addition for Galois field, the highest item in the first column $C_1$, that is, $a_3b_3$ is positioned at the position of $X^4$ in the generated polynomial G(X) with reference to the second column $C_2$. Taking into consideration the fact that in the addition for Galois field, "$X^4$" of the first column is converted into "X+1" ($X^4 \rightarrow X+1$) which is, in turn, added to the second column, the result of the addition operation in Example 2 is as follows:

Example 3)

```
      a₃b₃   a₂b₃   a₁b₃   a₀b₃         --- C₁
   +         a₃b₂   a₂b₂   a₁b₂   a₀b₂  --- C₂
   ─────────────────────────────────────
             a₂b₃   a₁b₃   a₀b₃   a₃b₃
         +   a₃b₂ + a₂b₂ + a₁b₂ + a₀b₂
                                + a₃b₃
```

Third, the addition operation is continuously executed in the same manner as in Example 3.

In the above calculation procedure, the second step is most important. In other words, the second step is a procedure of rotating left the items "$a_3b_3$", "$a_2b_3$", "$a_1b_3$" and "$a_0b_3$" of the first column $C_1$, adding the rotated items to corresponding items "$a_3b_2$", "$a_2b_2$", "$a_1b_2$" and "$a_0b_2$" of the second column $C_2$, and then adding the highest item "$a_3b_3$" of the first column $C_1$ to the second item (that is, "$a_0b_3 + a_1b_2$") of the result of the addition of the rotated items.

The reason why the highest item "$a_3b_3$" of the first column $C_1$ is added to the resultant second item is because the generated polynomial G(X) is equal to "$X^4+X+1$" (G(X)= $X^4+X+1$). In other words, the addition of the highest item "$a_3b_3$" of the first column $C_1$ is executed because the item "X" is the item remaining after the highest item "$X_4$" and the lowest item "1" are omitted from the generated polynomial G(X) and is arranged at the same position as the second item. In such a manner, any Galois fields may be operated.

An operation procedure carried out in the Galois field multiplier of FIG. 3 in accordance with the above-mentioned Galois field multiplication method will now be described in conjunction with a case wherein two kinds of inputs, one including four inputs A0 to A3 as the multiplicand and the other including four inputs B0 to B3 as the multiplier factor, are "1111" and "1111", respectively.

Since both inputs of each of the AND gates AD1 to AD4, AND gates AD5 to AD8, AND gates AD9 to AD12 and AND gates AD13 to AD16 are "1", each of the same AND gates generates an output of "1". As a result, an output of each of the exclusive OR gates XOR1 to XOR4 is "0" while an output of the exclusive OR gate XOR5 is "1". An output of each of the exclusive OR gates XOR6, XOR7, XOR9 and XOR10 is "1" while an output of the exclusive OR gate XOR8 is "0". On the other hand, an output of each of the exclusive OR gates XOR11, XOR12 and XOR13 is "0" while an output of each of the exclusive OR gate XOR14 and XOR15 is "1". Accordingly, the result which includes resultant outputs $C_1$ to $C_4$ corresponds to "1010".

The multiplication of the inputs "1111" for A0 to A3 and "1111" for B0 to B3 can be analyzed in accordance with the Galois field theory representing "G(X)=$X^4$+X+ 1, $2^1$=X, $2^2=X^2$, $2^3=X^3$, and $2^4=X^4$=X+1=3" as follows:

$$
\begin{aligned}
X^{12} &= (X^4)^3 \\
&= (X+1)^3 \\
&= (X+1)^2(X+1) \\
&= (X^2+X+X+1)(X+1) \\
&= (X^2+1)(X+1) \\
&= X^3+X^2+X+1 \\
\therefore A = B &= X^{12} = 2^{12} \\
\therefore A \times B &= 2^{12} \times 2^{12} \\
&= 2^{24} \\
&= 2^{15} \times 2^9 \\
&= 1 \times (X^3+X) \\
&= X^3+X \\
\because 2^{15} &= X^{15} \\
&= X^{12} \cdot X^3 \\
&= (X^3+X^2+X+1)X^3 \\
&= X^6+X^5+X^4+X^3 \\
&= X^4(X^2+X+1)+X^3 \\
&= (X+1)(X^2+X+1)+X^3 \\
&= X^3+X^2+X+X^2+X+1+X^3 \\
&= 1, \text{ and} \\
2^9 &= X^9 \\
&= X^4 \cdot X^4 \cdot X \\
&= (X+1)(X+1)X \\
&= (X^2+X+X+1)X \\
&= (X^2+1)X \\
&= X^3+X
\end{aligned}
$$

Accordingly, it can be found that this result corresponds to the result value "1010" of the operation carried out in the circuit of FIG. 3. By referring to the multiplication table of FIG. 1, this result is also easily confirmed as "F×F=A".

Figure 4:
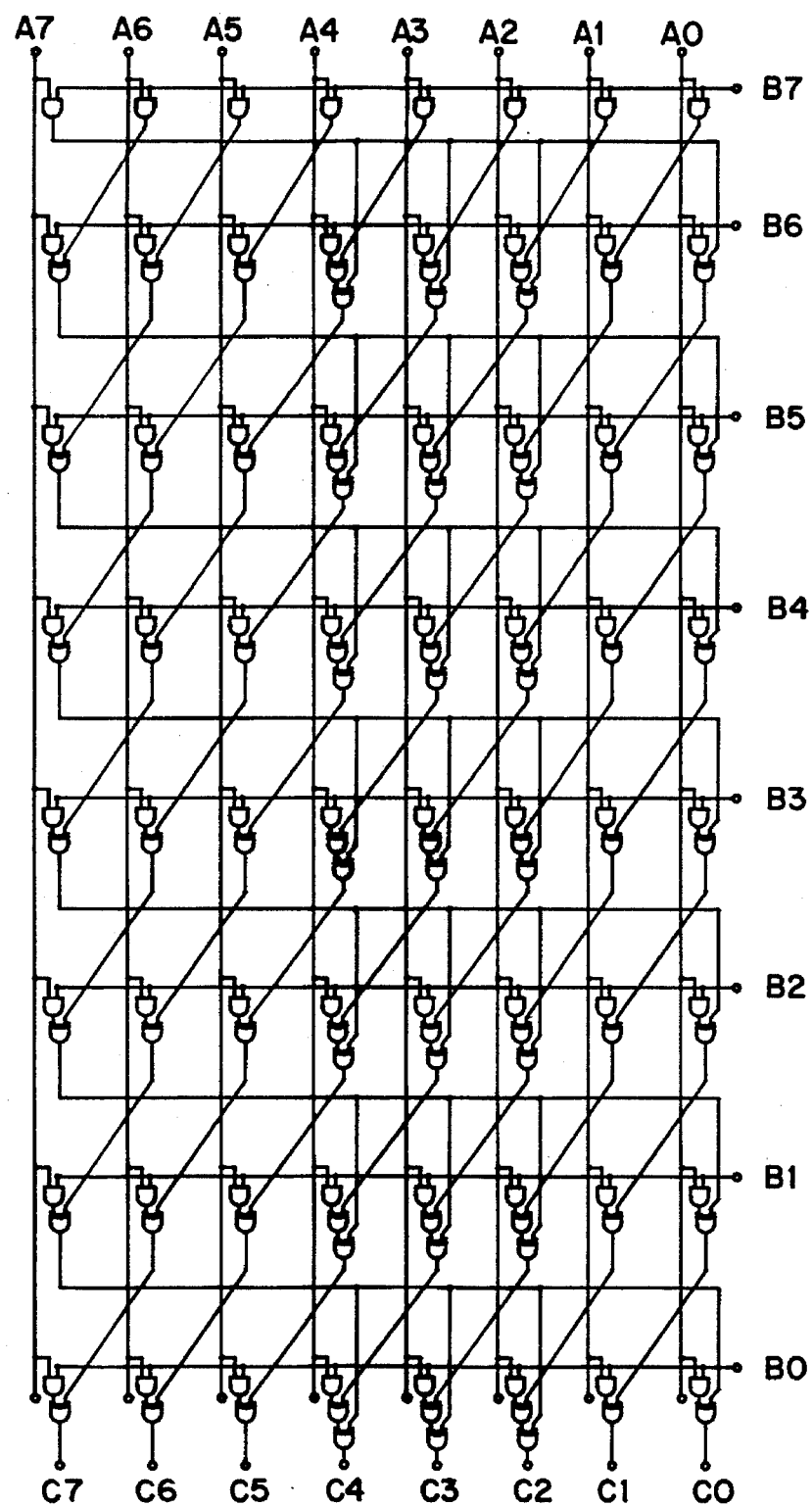
FIG. 4 is a circuit diagram of a multiplier to which the multiplication method of the present invention is applied in accordance with a second embodiment of the present invention in order to realize a multiplication for a Galois field GF(256) defined by a generated polynomial G(X) (G(X)= $X^8+X^4+X^3+X^2+1$)

FIG. 4 is a circuit diagram of a multiplier to which the multiplication method of the present invention is applied in accordance with a second embodiment of the present invention. In accordance with the second embodiment of the present invention, the multiplier of FIG. 4 is adapted for GF(256) defined by a generated polynomial G(X) (G(X)= $X^8+X^4+X^3+X^2+1$) being used for compact disc (CD) and digital compact cassette (DCC).

Figure 5:
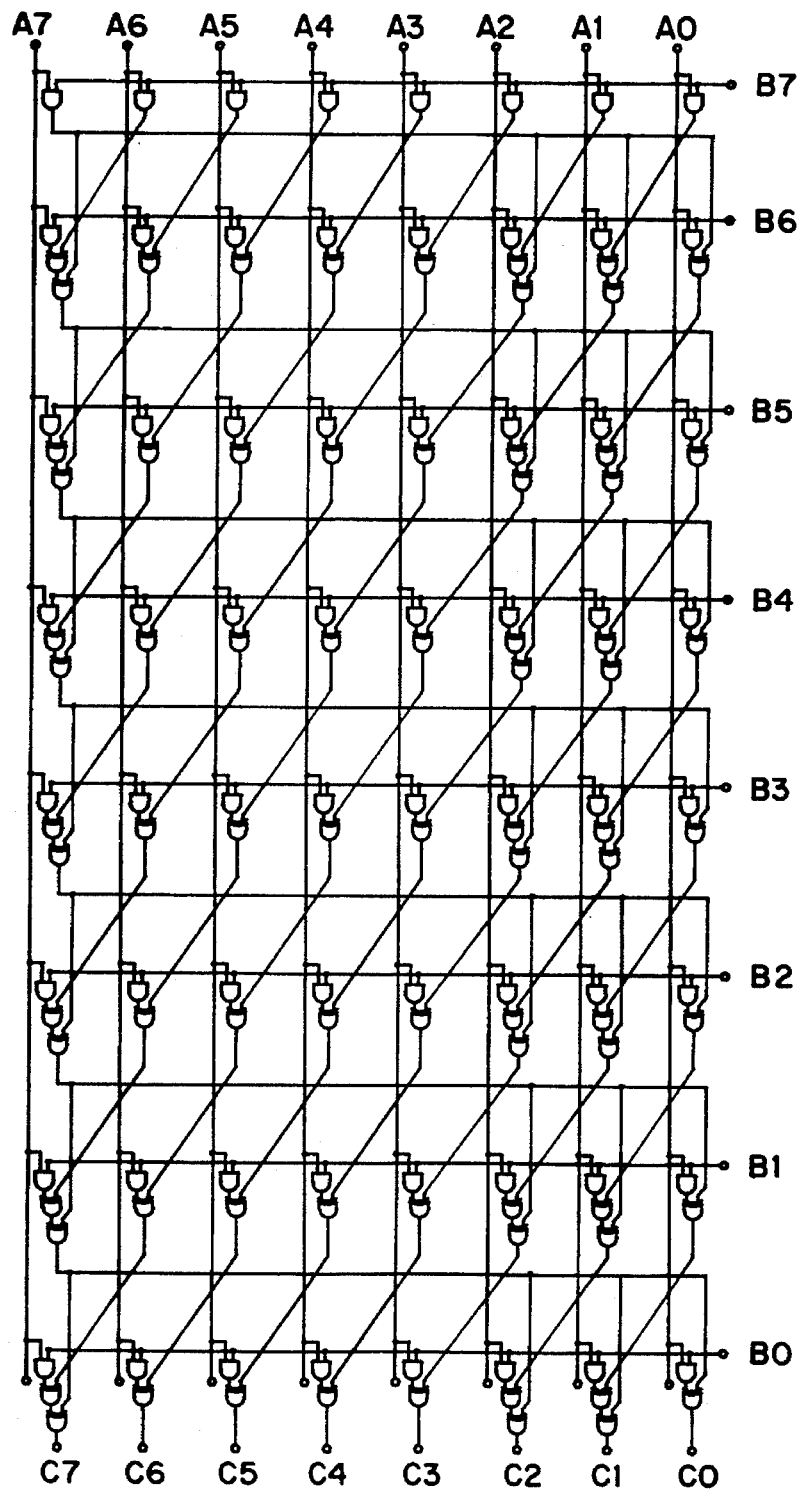
FIG. 5 is a circuit diagram of a multiplier to which the multiplication method of the present invention is applied in accordance with a third embodiment of the present invention in order to realize a multiplication for a Galois field GF(256) defined by a generated polynomial G(X) (G(X)=$X^8+X^7+X^2+X+1$).

On the other hand, FIG. 5 is a circuit diagram of a multiplier to which the multiplication method of the present invention is applied in accordance with a third embodiment of the present invention. In accordance with this embodiment of the present invention, the multiplier of FIG. 5 is adapted for GF(256) defined by a generated polynomial G(X) (G(X) =$X^8+X^7+X^2+X+1$) being used for high definition TV (HDTV).

As apparent from the above description, the present invention provides a Galois field multiplication method including the steps of ANDing respective items of a multiplicand and respective corresponding one of items of a multiply factor in a stepwise manner, rotating left values resulted from the AND operation at a previous step, exclusively ORing respective values resulted from the rotation and respective corresponding values resulted from the And operation at a current step, and operating the highest item generated at the previous step in accordance with a generated polynomial. This method is embodied, taking into consideration the fact that when items generated in an multiplication for Galois field are added to one another, a phenomenon where the degree of the highest item of a generated polynomial is decreased occurs. In accordance with the method, it is possible to achieve a simpleness in design and an obviousness in flow of signals.

Although the preferred embodiments of the invention have been disclosed for illustrative purposes, those skilled in the an will appreciate that various modifications, additions and substitutions are possible, without departing from the scope and spirit of the invention as disclosed in the accompanying claims.

What is claimed is:

1. A Galois field multiplier for operating a mutiplicand and a multiplier of a Galois field, comprising:

a first operating unit including first AND gates each ANDing a value of a corresponding bit of the multiplicand and a value of the most significant bit of the multiplier; and a plurality of additional operating units corresponding to the remaining bits of the multiplier from the second most significant bit to the least significant bit, each of the additional operating units including:

second AND gates each ANDing the value of the corresponding bit of the multiplicand and a value of one of the remaining bite of the multiplier, first exclusive OR gates each operating on a corresponding output value of the second AND gates and a corresponding output value obtained by rotating left output values of a preceding operating unit, and second exclusive OR gates each operating on an output value of one of the first exclusive OR gates respectively corresponding to terms of a polynomial which characterizes a present Galois field, and a value of the most significant bit of the output value of the preceding operating unit, wherein each of the additional operating units is connected to the preceding operating unit being either the first operating unit or one of the additional operating units.

2. The Galois field multiplier of claim 1, wherein the terms of the polynomial are exclusive of the highest term and the lowest term of the polynomial.

3. The Galois field multiplier of claim 1, wherein the plurality of additional operating units include second, third and fourth operating units, the first operating unit being connected to the second operating unit, the second operating unit being connected to the third operating unit, the third operating unit being connected to the fourth operating unit.

4. A Galois field multiplier for operating a multiplicand and a multiplier of a Galois field, comprising:

a first operating unit including first means for ANDing a value of each corresponding bit of the multiplicand and a value of the most significant bit of the multiplier; and a plurality of additional operating units corresponding to the remaining bits of the multiplier from the second most significant bit to the least significant bit, each of said additional operating units including:

second means for ANDing the value of each corresponding bit of the multiplicand and a value of one of the remaining bits of the multiplier, third means for exclusive-ORing each corresponding output value of said second means and a corresponding output value obtained by rotating left output values of a preceding operating unit, and fourth means for exclusive-ORing an output value of said third means respectively corresponding to terms of a polynomial which characterizes a present Galois field, and a value of the most significant bit of the output value of the preceding operating unit, wherein each of said additional operating units is connected to the preceding operating unit being either said first operating unit or one of said additional operating units.

5. The Galois field multiplier of claim 4, wherein the terms of the polynomial are exclusive of the highest term and the lowest term of the polynomial.

6. The Galois field multiplier of claim 4, wherein said plurality of additional operating units include second, third and fourth operating units, said first operating unit being connected to said second operating unit, said second operating unit being connected to said third operating unit, said third operating unit being connected to said fourth operating unit.

* * * * *